United States Patent
Seong

(10) Patent No.: US 7,881,127 B2
(45) Date of Patent: Feb. 1, 2011

(54) NONVOLATILE MEMORY DEVICE AND METHOD OF TESTING THE SAME

(75) Inventor: Jin Yong Seong, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 69 days.

(21) Appl. No.: 12/468,384

(22) Filed: May 19, 2009

(65) Prior Publication Data

US 2009/0290435 A1 Nov. 26, 2009

(30) Foreign Application Priority Data

May 20, 2008 (KR) .................. 10-2008-0046602
Jan. 21, 2009 (KR) .................. 10-2009-0005086

(51) Int. Cl.
*G11C 7/00* (2006.01)

(52) U.S. Cl. .............. 365/189.05; 365/201; 365/185.18

(58) Field of Classification Search ............ 365/189.05, 365/200, 185.18
See application file for complete search history.

(56) References Cited

U.S. PATENT DOCUMENTS 5,627,780 A * 5/1997 Malhi .................... 365/189.05
5,930,188 A * 7/1999 Roohparvar ................ 365/201

FOREIGN PATENT DOCUMENTS

| JP | 2004-054892 | 2/2004 |
|---|---|---|
| KR | 1020020072371 | 9/2002 |
| KR | 100357022 | 10/2002 |
| KR | 1020080069778 | 7/2008 |

\* cited by examiner

*Primary Examiner*—Huan Hoang
(74) *Attorney, Agent, or Firm*—IP & T Group LLP

(57) ABSTRACT

A nonvolatile memory device includes a clock input stage configured to receive a clock signal for a test, a control signal output unit configured to output data input-output (IO) control signals according to the clock signal, n number of IO stages for data IO, and n number of storage units connected to the respective n number of IO stages and configured to temporarily store data to be exchanged between the respective n number of IO stages and internal circuits according to the respective data IO control signals. The n number of storage units are further commonly connected to a first IO stage of the n number of IO stages and configured to sequentially input or output data through the first IO stage in a test mode according to the respective data IO control signals.

16 Claims, 8 Drawing Sheets

US 7,881,127 B2

NONVOLATILE MEMORY DEVICE AND METHOD OF TESTING THE SAME

CROSS-REFERENCES TO RELATED APPLICATIONS

The present application claims priority to Korean patent application number 2008-0046602, filed on May 20, 2008 and Korean patent application number 2009-0005086, filed on Jan. 21, 2009, disclosures of which are incorporated herein by reference in their entireties.

BACKGROUND

One or more embodiments relate to a nonvolatile memory device and a method of testing the same.

A flash memory (i.e., a nonvolatile memory) is chiefly divided into a NAND flash memory and a NOR flash memory. The NOR flash memory has an excellent random access time characteristic because it has a structure in which memory cells are independently connected to respective bit lines and respective word lines. The NAND flash memory is excellent in terms of the integration level because it has a structure in which memory cells are connected in series, requiring only one contact per cell string. Accordingly, the NAND structure is for the most part used in a high-integrated flash memory.

The above nonvolatile memory device is formed on a wafer and is configured to include a number of dies in one wafer. After the dies are tested in order to determine whether each of the dies properly operates on the wafer, only normal dies are cut and packaged. Here, one or more dies may be packaged, thereby forming one nonvolatile memory chip.

Meanwhile, a tester for testing the dies on the wafer has a predetermined number of channels. After the channels are connected to the data In-Out (IO) pins of the dies, data is inputted for a test and test results are outputted to the tester. Whether the dies normally operate can be determined based on the test results.

Since the number of channels of the tester is limited, the number of dies which can be tested at the same time depends on the number of channels connected to the dies.

FIG. 1 is a block diagram showing a known channel connection for a wafer test.

Referring to FIG. 1, the channels CH of a tester 110 are connected to dies on a wafer 120. The number of dies 121 on the wafer 120 is 'm' and the number of channels CH of the tester 110 is fixed. Thus, the channels CH of the tester 110 are not connected to all the m dies 121, but only n dies are connected to the channels CH of the tester 110. Here, m>n, and m and n are positive integers.

In order to test the dies 121, a program command, an address, and data to be programmed have to be inputted. To this end, the tester 110 connects the channels to the pins of each of the dies 121.

In general, each of the dies 121 includes eight IOs pins IO<7:0> for data inputs. The die 121 further includes a control signal input pin for determining whether input data is a command, an address, or data to be programmed.

In the case where the eight IOs pins IO<7:0> and the control signal input pin are connected to the respective channels of the tester 110, data is inputted for a test and the test results can be checked through the tester 110. As shown in FIG. 1, the tester 110 can test several dies at the same time in the case where the channels of the tester are connected to a number of dies.

Data IOs for a test in the case where the channels are connected to a number of the dies as shown in FIG. 1 are as follows.

FIGS. 2A and 2B are timing diagrams showing data IOs for executing a test.

FIG. 2A is a timing diagram showing a case where test data is input, and FIG. 2B is a timing diagram showing a case where test results are output.

Referring to FIG. 2A, the test data is input to each of the dies through the channels of the tester 110. Here, a clock CLK is inputted through one of the channels of the tester 110, and 8-bit data is inputted through each of the eight IOs pins int_IO<7:0> respectively connected to the remaining channels of the tester 110.

As described above, the data is inputted through each of the eight IOs pins on an 8-bit basis. For example, the data D0 of FIG. 2A is 8-bit data and can be represented by D0<7:0>.

In the case where test results are outputted, a clock CLK is input through one of the channels of the tester 110, and data is outputted through each of the eight IOs pins Out<7:0>, as shown in FIG. 2B. Here, when data is inputted, the respective IO pins are represented by int_IO<7:0> and, when data is outputted, the respective IO pins are represented by Out<7:0>.

The reason why a test is performed as described above is that, since the number of channels included in the tester 110 is limited as described above, the number of dies which can be tested at one time is also limited. If it is sought to test more dies using the same number of channels, the number of channels, connected one die, must be reduced.

To this end, a method of performing a test in the state where all channels are not connected to the eight IOs pins, but only at least four channels are connected to the eight IOs pins was developed.

BRIEF SUMMARY

One or more embodiments are directed towards a nonvolatile memory device and a method of testing the same, which is capable of testing a larger number of dies on a wafer at one time by minimizing the number of channels connected to the dies for data inputs when the dies are tested.

One or more embodiments are directed to a nonvolatile memory device, including a clock input stage configured to receive a clock signal for a test; a control signal output unit configured to output data input-output (IO) control signals according to the clock signal; n number of IO stages for data IO, n being a positive integer; and n number of storage units connected to the respective n number of IO stages and configured to temporarily store data to be exchangeable between the respective n number of IO stages and internal circuits according to the respective data IO control signals. The n number of storage units are further commonly coupled to a first IO stage of the n number of IO stages and configured to sequentially input or output data through the first IO stage in a test mode, according to the respective data 10 control signals.

The data IO control signals, in the test mode, include n number of data input enable signals to allow data bits inputted through the first IO stage to be sequentially stored in the respective n number of storage units, and a first control signal to allow the data bits stored in the respective n number of storage units to be outputted to the internal circuits at the same time.

The data IO control signals, in the test mode, include n number of data output enable signals sequentially generated to allow test result data stored in the n number of storage units to be sequentially output to the first IO stage.

Each of the n number of storage units includes a latch unit configured to temporarily store IO data; a multiplexer (MUX) connected to the first IO stage and a pertinent one of the n number of IO stages and configured to select one of the first IO stage and the pertinent IO stage according to a pertinent one of the data IO control signals; an input unit configured to transfer data, inputted from the MUX to the latch unit; and an output unit configured to transfer the data, stored in the latch unit, to the MUX.

The nonvolatile memory device is configured to further receive a command enable control signal, inputted when data input for the test in the test mode is command information, and an address enable control signal inputted when the data input for the test is address information.

A method of testing a nonvolatile memory device includes inputting data for a test on a bit-by-bit basis through a first IO stage of n number of IO stages in a test mode; sequentially storing the input data in respective data storage units, connected to the respective n number of IO stages, according to respective first control signals; and transferring the data, stored in the data storage units, to an internal circuit of the nonvolatile memory device at the same time according to a second control signal.

The method further includes performing the test using the data transferred to the internal circuit.

The method further includes inputting results of performing the test using the data to the respective data storage units; and sequentially outputting the result data, stored in the data storage units, through the first IO stage according to respective third control signals.

The first to third control signals are outputted in synchronism with an externally input clock signal.

A number of nonvolatile memory devices are tested at the same time in the test mode.

The first control signals include n number of data input enable signals which enable the data, sequentially applied to the respective data storage units and inputted through the first IO stage, to be sequentially stored in the data storage units.

The third control signals include n data output enable signals which enable the data, sequentially applied to the data storage units and stored in the data storage units through the first IO stage, to be sequentially outputted.

A semiconductor memory apparatus includes a number of semiconductor dies electrically couple to a tester through a plurality of channels, said each semiconductor die including a clock input stage configured to receive a clock signal for a test through at least one channel, a control signal output unit configured to output data input-output (IO) control signals according to the clock signal, n number of IO stages for data IO, n being a positive integer, and n number of storage units connected to the respective n number of IO stages and configured to temporarily store data to be exchangeable between the respective n number of IO stages and internal circuits according to the respective data IO control signals. A first IO stage of the n number of IO stage is coupled to at least one channel, and the n number of storage units are further commonly coupled to the first IO stage and configured to sequentially input or output data through the first IO stage in a test mode, according to the respective data IO control signals.

DESCRIPTION OF SPECIFIC EMBODIMENT

Hereinafter, the present disclosure will be described in detail in connection with one or more embodiments with reference to accompanying drawings. The figures are provided to allow those having ordinary skill in the art to understand the scope of one or more embodiments of the present invention.

Figure 1:
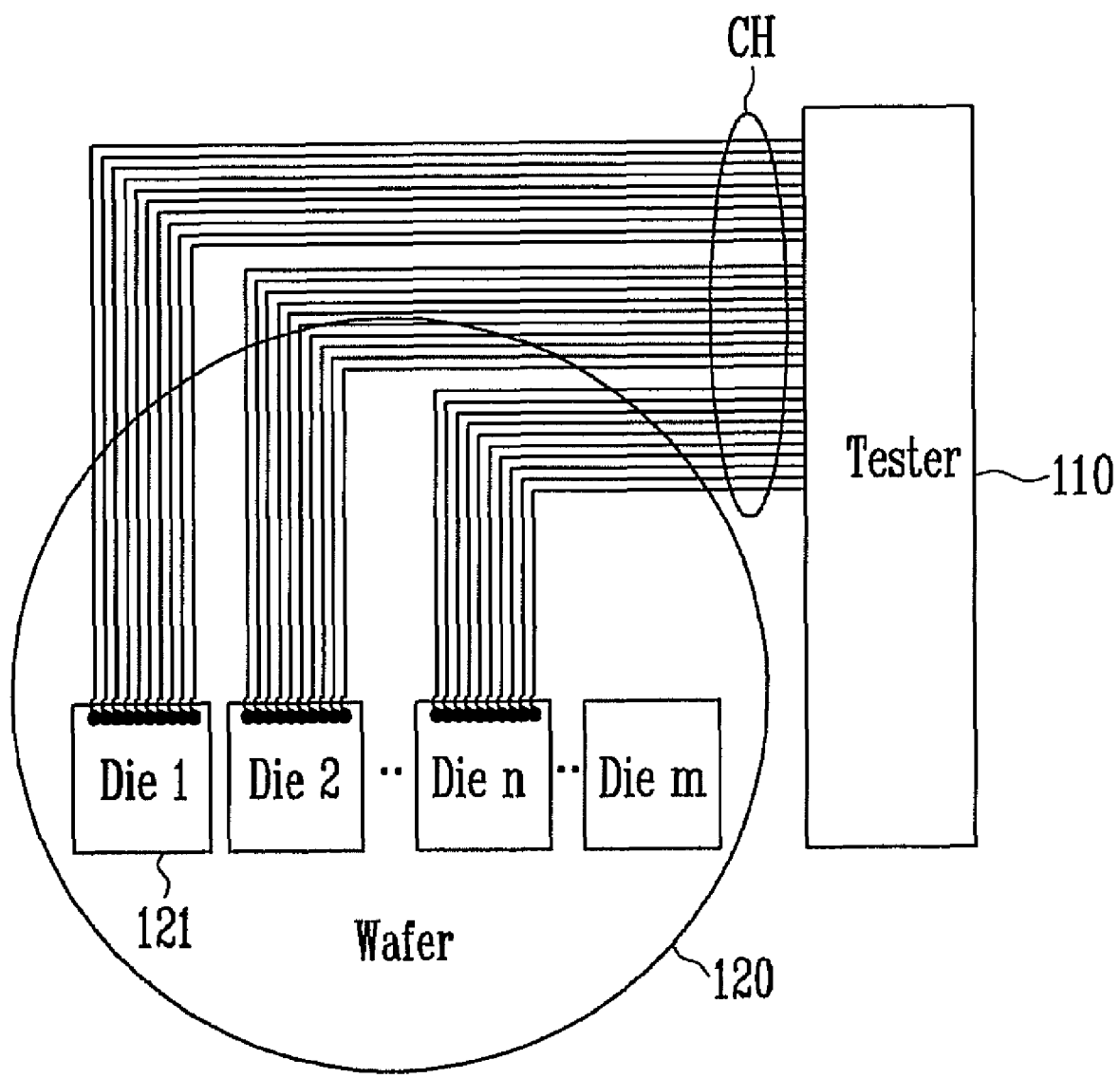
FIG. 1 is a block diagram showing a known channel connection for a wafer test.
Figure 2A:
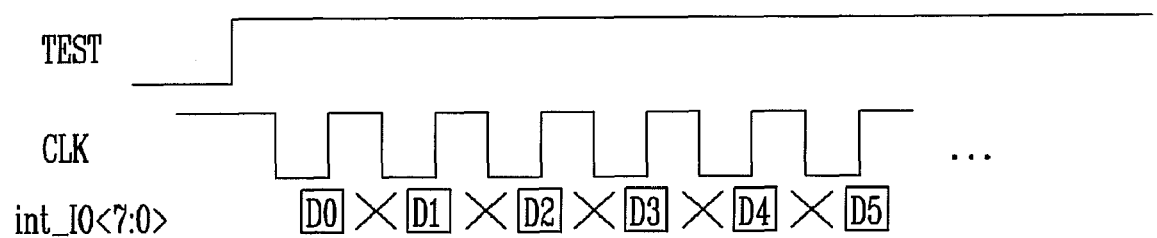
FIGS. 2A and 2B are timing diagrams showing data IOs for executing a test.
Figure 2B:
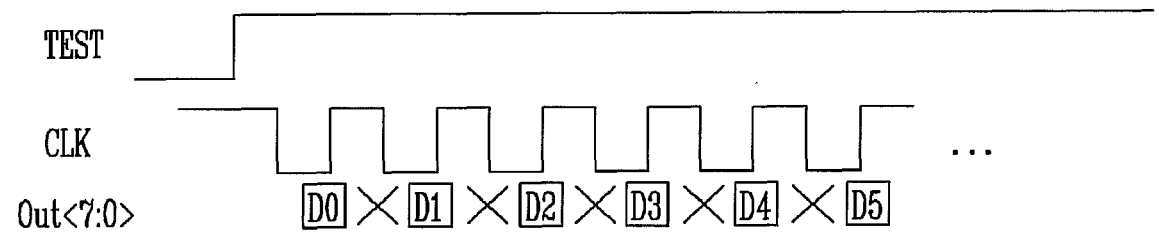
Figure 3A:
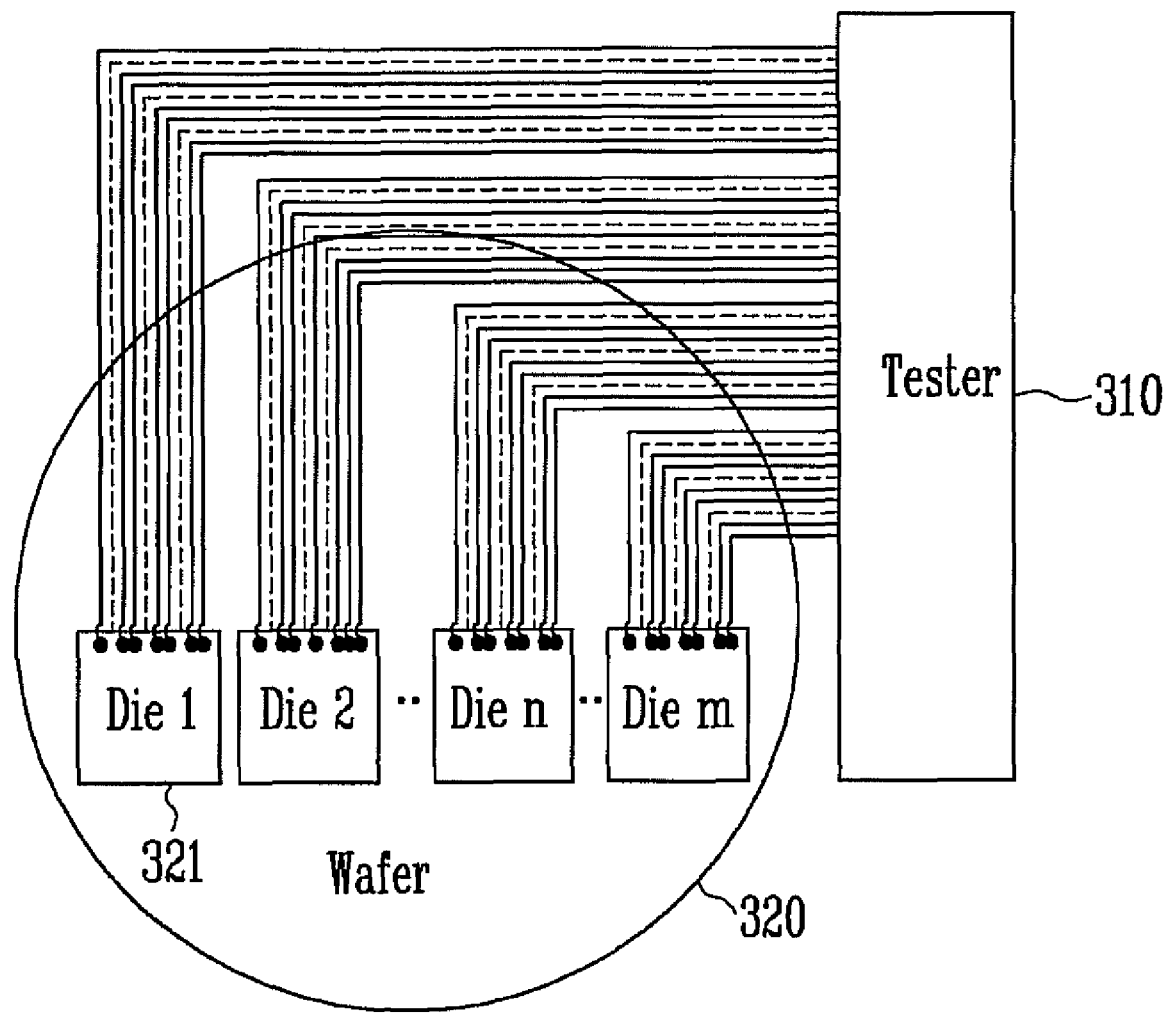
FIG. 3A is a block diagram showing a channel connection for testing a nonvolatile memory device according to one or more embodiments of the present invention.

FIG. 3A is a block diagram showing a channel connection for testing a nonvolatile memory device according to one or more embodiments of the present invention.

Referring to FIG. 3A, the channels of a tester 310 are connected to m dies (die1 to diem) formed on a wafer 320. Dotted lines of FIG. 3A indicate ones in which channels were conventionally connected to dies, but are not connected to the dies according to one or more embodiments of the present invention. FIG. 3A is illustrated to show that the number of channels connected to dies is reduced as compared with the above described art. For example, the number of channels connected between the die 1 321 and the tester 310 may differ depending on conditions. One or more dies may be included in a nonvolatile memory device. A nonvolatile memory device further receives a command enable control signal inputted when data input for a test in a test mode is command information, and an address enable control signal inputted when the data input for the test is address information.

If the number of channels connected to the respective m number of dies is reduced as shown in FIG. 3A, the number of dies connected to the tester 310 at one time can be increased. To this end, in one or more embodiments, the number of channels connected to IO pins for data IO is reduced to one. Accordingly, the number of channels connected to the dies is reduced to channels for inputting a clock and a control signal and a channel connected to one IO stage.

The input and output of data for a test by connecting channels to one IO stage is described below.

Figure 3B:
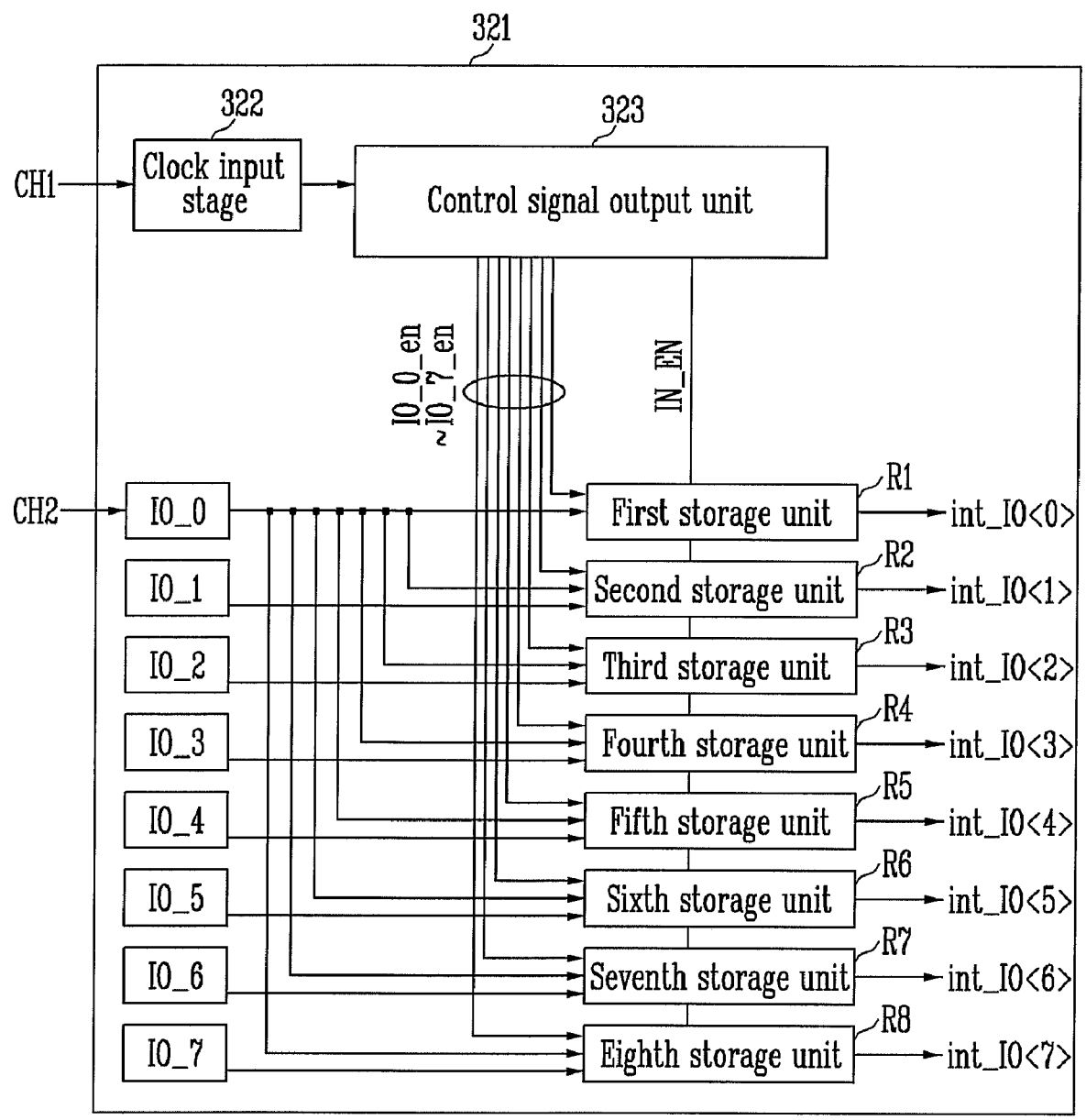
FIG. 3B is a block diagram showing data inputs to a die for test data inputs.

FIG. 3B is a block diagram showing data inputs to dies for test data inputs.

Referring to FIG. 3B, there is shown, for example, the die 1 321 of the m number of dies on the wafer 320. The die 1 321 includes a clock input stage 322 to which a clock for synchronizing an operation is inputted, a control signal output unit 323, first to eighth IOs IO_0 to IO_7, and first to eighth storage units R<1:8> configured to temporarily store data received from the respective IOs IO_0 to IO_7.

The clock input stage 322 and the first to eighth IOs IO_0 to IO_7 are configured to receive a clock and data which are inputted from an external circuit (not shown). According to one or more embodiments of the present invention, the first channel CH1 of the tester 310 is connected to the clock input stage 322, and the second channel CH2 thereof is connected to the first IO IO_0. A clock is input to the first channel CH1 of the tester 310, and data is inputted to the second channel CH2 of the tester 310.

The control signal output unit 323 sequentially outputs first to eighth IO enable signals IO_0_en to IO_7_en, for sequentially transferring data inputted through the first IO IO_0, to the first to eighth storage units R1 to R8 according to the clock signal inputted through the clock input stage 322.

After outputting the first to eighth IO enable signals IO_0_en to IO_7_en once, the control signal output unit 323 inputs an input enable signal IN_EN to the first to eighth storage units R1 to R8 at the same time. The input enable signal IN_EN enables data, stored in the first to eighth storage units R1 to R8, to be inputted to the inside of the die 1 321.

The first to eighth storage units R1 to R8 are connected to the first to eighth IOs IO_0 to IO_7, respectively, and are configured to temporarily store data received therefrom. The first to eighth storage units R1 to R8 also function to transfer stored data to the inside of the die 1 321 through respective internal IOs int_IO<7:0>. Further, in a test mode, the first to eighth storage units R1 to R8 store data received from the first IO IO_0 in response to the respective first to eighth IO enable signals IO_0_en to IO_7_en and output stored data to the respective internal IO int_IO<7:0> in response to the input enable signal IN_EN.

A process of receiving data, inputted through the tester 310, through the first IO IO_0 as described above is described below.

Figure 3C:
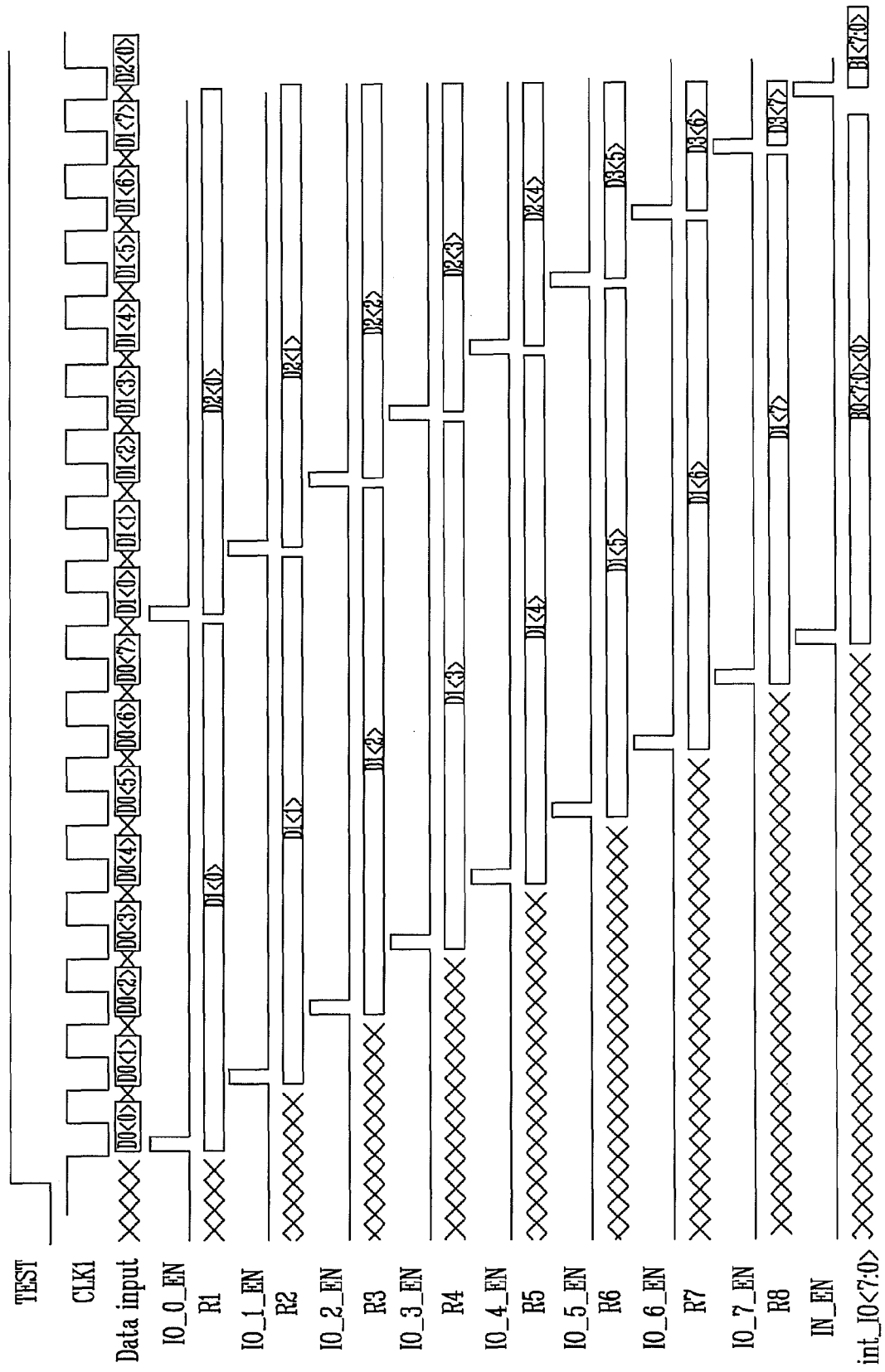
FIG. 3C is a timing diagram showing the data input operation of FIG. 3B.

FIG. 3C is a timing diagram showing the data input operation of FIG. 3B.

Referring to FIG. 3C, while, in a test mode, a clock is input to the clock input stage 322 through the first channel CH1, data is sequentially input to the first IO IO_0 on a bit-by-bit basis. Here, the input data bits belong to data groups which had been inputted at a time through the eight IOs. In other words, data bits D0<7:0> of FIG. 3C belong to a data group D0 which had been inputted to the respective eight IOs at a time.

Meanwhile, the control signal output unit 323 sequentially applies the first to eighth IO enable signals IO_0_en to IO_7_en and the input enable signal IN_EN in response to the clock. Here, the applied control signals are applied as a logic high level and then changed to a logic low level, in the form of a pulse.

When the first IO enable signal IO_0_en is applied as a logic high level, data input to the first IO IO_0 is stored in the first storage unit R1. When the second IO enable signal IO_1_en is applied as a logic high level, data input to the first IO IO_0 is stored in the second storage unit R2.

Accordingly, when the control signal output unit 323 sequentially applies the first to eighth IO enable signals IO_0_en to IO_7_en, the data bits D0<7:0> inputted through the first IO IO_0 are sequentially stored in the first to eighth storage units R1 to R8.

Further, when the input enable signal IN_EN is inputted, the data bits D0<7:0> respectively stored in the first to eighth storage units R1 to R8 are outputted to the respective internal IOs int_IO<7:0>.

While, as described above, the control signal output unit 323 sequentially outputs the first to eighth IO enable signals IO_0_en to IO_7_en and the input enable signal IN_EN according to the clock, data bits are inputted through the first IO IO_0.

Through the above operation, a method of receiving data within the die 1 321 may be recognized as if 8-bit data is received at a time in the same manner as the existing method. In this case, the input time may become long because data, which may be inputted by eight bits at a time, has to be inputted on a bit-by-bit basis. If channel connect through only one IO as described above, however, channel connection to more dies may be possible in the tester 310. If the number of dies connected to one tester 310 increases, the number of dies which can be tested at the same time increases. Accordingly, the time that it takes to test all the dies of the wafer 320 can be significantly reduced.

The die 1 321 performs a program operation based on data input as described above and outputs the operation results to the tester 310. Here, the program operation is identical to a process of a nonvolatile memory device performing a program operation for a test, and a description thereof is omitted.

In order to output test results, the following operation is performed.

Figure 3D:
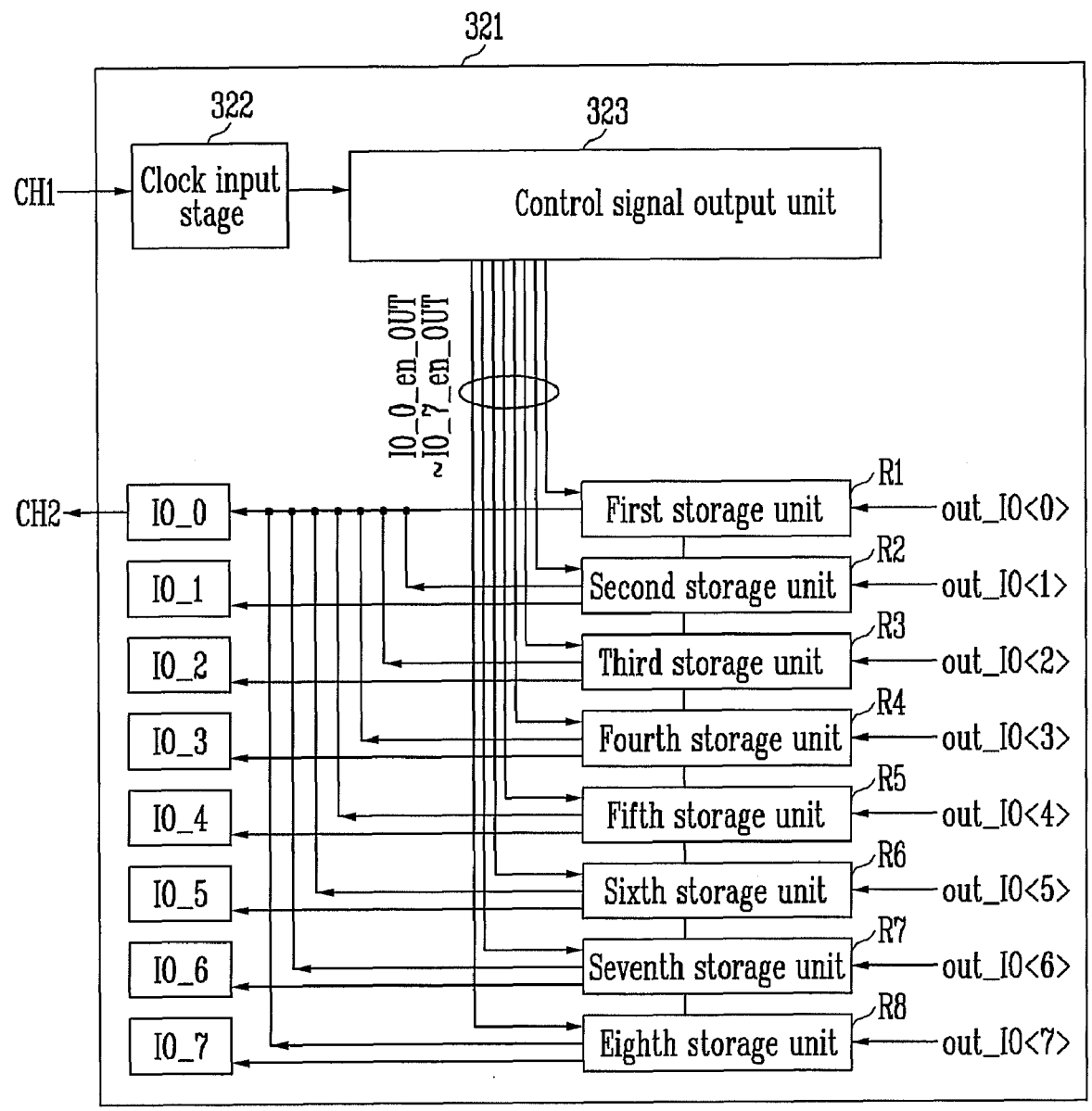
FIG. 3D is a block diagram showing data outputs from a die for test result outputs.

FIG. 3D is a block diagram showing data outputs from a die for test result outputs.

Referring to FIG. 3D, in the die 1 321, the first channel CH1 is connected to the clock input stage 322 and the second channel CH2 is connected to the first IO IO_0.

The clock input stage 322 provides an operation clock CLK, received from the first channel CH1, to the control signal output unit 323. The control signal output unit 323 sequentially applies first to eighth IO output enable signals IO_0_en_OUT to IO_7_en_OUT to the first to eighth storage units R1 to R8, respectively, according to the operation clock CLK generated by the clock input stage 322. Here, the first to eighth storage units R1 to R8 are configured to store test result data outputted on an 8-bit basis from the inside of the die 1 321. The first to eighth IO output enable signals IO_0_en_OUT to IO_7_en_OUT are configured to sequentially transfer the data of the first to eighth storage units R1 to R8 to the first IO IO_0.

The first to eighth storage units R1 to R8 temporarily store test result data output from the respective internal output stages out_IO<7:0> of the die 1 321.

Further, when the first to eighth IO output enable signals IO_0_en_OUT to IO_7_en_OUT are respectively applied to the first to eighth storage units R1 to R8, the first to eighth storage units R1 to R8 transfer temporarily stored test result data to the first IO IO_0.

The tester 310 may check the test results by analyzing data which is outputted on a bit-by-bit basis through the second channel CH2.

A process of outputting the test result data, output to the tester 310, through the first IO IO_0 as described above is as follows.

Figure 3E:
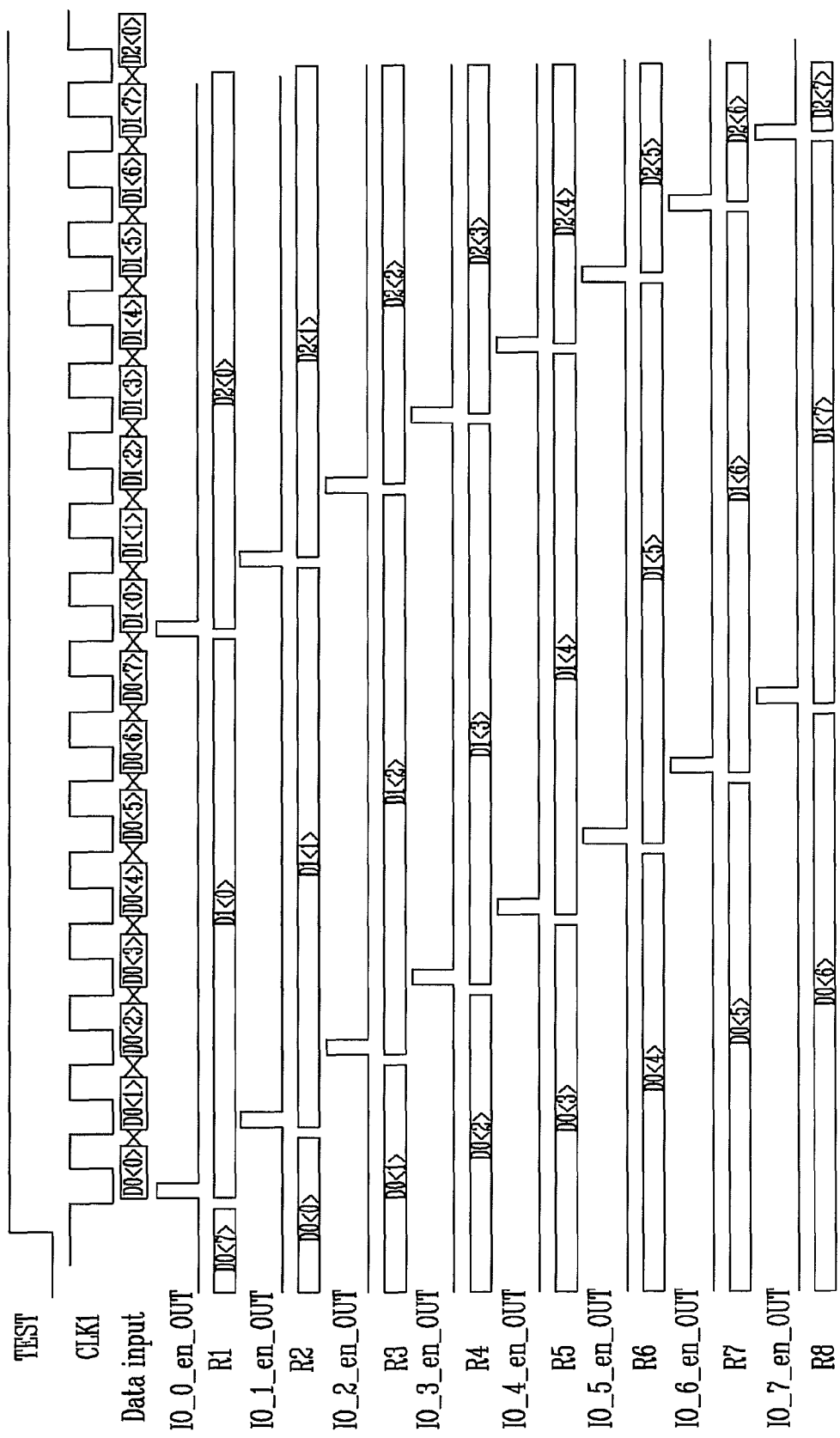
FIG. 3E is a timing diagram showing the data output operation of FIG. 3D.

FIG. 3E is a timing diagram showing the data output operation of FIG. 3D.

Referring to FIG. 3E, the clock CLK is inputted to the first channel CH1 of the tester 310, and the test result data is outputted to the first IO IO_0 on a bit-by-bit basis according to the clock. At this time, 8-bit data is inputted to each of the first to eighth storage units R1 to R8 at a time. Furthermore, the data of the first to eighth storage units R1 to R8 is sequentially outputted to the first IO IO_0 according to the first to eighth IO output enable signals IO_0_en_OUT to IO_7_en_OUT of the control signal output unit 323.

The first to eighth storage units R1 to R8 may be configured as follows.

Figure 3F:
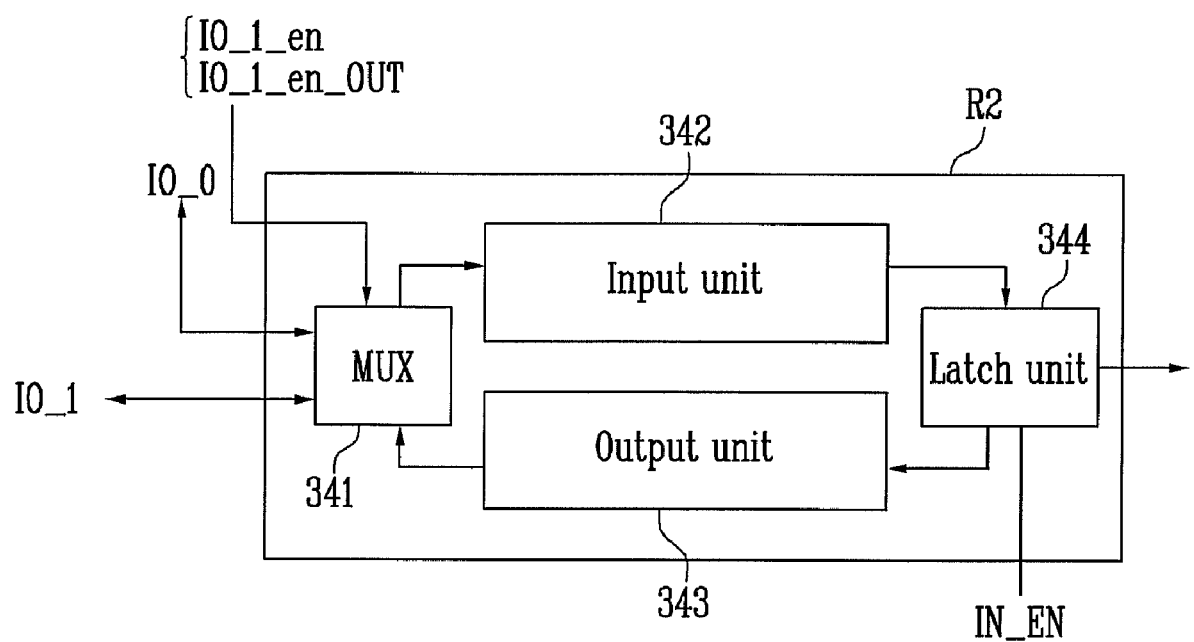
FIG. 3F is a block diagram of a second storage unit of FIGS. 3B and 3D.

FIG. 3F is a block diagram of the second storage unit of FIGS. 3B and 3D.

Referring to FIG. 3F, the second storage unit R2 includes a multiplexer (MUX) 341, an input unit 342, an output unit 343, and a latch unit 344. Here, since the first to eighth storage units R1 to R8 of FIGS. 3B and 3D have the same construction, only the second storage unit R2 is described as a representative example.

Furthermore, unlike each of the second to eighth storage units R2 to R8, the first storage unit R1 may be configured in the same manner as the storage unit of the existing nonvolatile memory device. This is because the first storage unit R1 is connected to the first IO IO_0 as in the existing storage unit and, therefore, IO control needs not to be performed according to the first IO enable signal IO_0_en or the first IO output enable signal IO_0_en_OUT. Accordingly, the second to eighth storage units R2 to R8 other than the first storage unit R1 may be configured like the second storage unit R2.

The second storage unit R2 is connected to data input lines of the first IO IO_0 and the second IO IO_1. The MUX 341 selects any one of the first IO IO_0 and the second IO IO_1.

That is, when the second IO enable signal IO_1_en is in a logic low level, the MUX 341 selects a connection line to the second IO IO_1. When the second IO enable signal IO_1_en is in a logic high level, the MUX 341 selects a connection line to the first IO IO_0.

The input unit 342 receives data, input from a connection line selected by the MUX 341, and stores the received data in the latch unit 344. The output unit 343 outputs the data, stored in the latch unit 344, to the MUX 341. Here, the input data stored in the latch unit 344 is transferred from the first to eighth storage units R1 to R8 to the inside at the same time according to the input enable signal IN_EN.

When data is inputted, the second storage unit R2 receives data from the first IO IO_0 according to the second IO enable signal IO_1_en and stores the received data in the latch unit 344. Next, when the input enable signal IN_EN is inputted in the state where input data is all latched in the first to eighth storage units R1 to R8, the input data stored in the latch unit 344 is transferred to the inside at the same time.

When the data output from the inside is stored in the latch unit 344, the output unit 343 transfers the data, stored in the latch unit 344, to the MUX 341.

When the second IO output enable signal IO_1_en_OUT is in a logic high level, the MUX 341 connects the connection line to the first IO IO_0 to the output unit 343 so that data can be output.

If data inputs and outputs are performed according to the above method, the tester 310 can test more dies using a limited number of channels. Accordingly, the test time that it takes to test many dies can be reduced.

Furthermore, although data is input to or output from the dies on a bit-by-bit basis, the existing 8-bit unit is maintained when the data is internally inputted or outputted. Accordingly, there is no problem in operation.

As described above, according to the nonvolatile memory device and the method of testing the same according to one or more embodiments, only one IO is connected to one of the channels of the tester so that data for a test can be inputted or outputted. Accordingly, the test time and expenses can be effectively reduced because a larger number of dies can be tested at a time.

What is claimed is:

1. A nonvolatile memory device, comprising:
   a clock input stage configured to receive a clock signal for a test;
   a control signal output unit configured to output data input-output (IO) control signals according to the clock signal;
   n number of IO stages for data IO, n being a positive integer; and
   n number of storage units connected to the respective n number of IO stages and configured to temporarily store data to be exchanged between the respective n number of IO stages and internal circuits according to the respective data IO control signals,
   wherein the n number of storage units are further commonly connected to a first IO stage of the n number of IO stages and configured to sequentially input or output data through the first IO stage in a test mode, according to the respective data IO control signals.

2. The nonvolatile memory device of claim 1, wherein the data IO control signals in the test mode comprise:
   n number of data input enable signals to allow data bits inputted through the first IO stage to be sequentially stored in the respective n number of storage units, and
   a first control signal to allow the data bits stored in the respective n number of storage units to be outputted to internal circuits at the same time.

3. The nonvolatile memory device of claim 1, wherein the data IO control signals in the test mode comprise:
   n number of data output enable signals sequentially generated to allow test result data stored in the n number of storage units to be sequentially outputted to the first IO stage.

4. The nonvolatile memory device of claim 1, wherein each of the n number of storage units comprises:
   a latch unit configured to temporarily store IO data;
   a multiplexer (MUX) connected to the first IO stage and a pertinent one of the n number of IO stages and configured to select one of the first IO stage and the pertinent IO stage according to a pertinent one of the data IO control signals;
   an input unit configured to transfer data, inputted from the MUX to the latch unit; and
   an output unit configured to transfer the data, stored in the latch unit, to the MUX.

5. The nonvolatile memory device of claim 1, wherein the nonvolatile memory device is configured to further receive a command enable control signal, inputted when data input for the test in the test mode is command information, and an address enable control signal inputted when the data input for the test is address information.

6. A method of testing a nonvolatile memory device, comprising:
   inputting data for a test on a bit-by-bit basis through a first IO stage of n number of input-output (IO) stages in a test mode;
   sequentially storing the input data in respective data storage units, connected to the n number of IO stages, according to respective first control signals; and
   transferring the data, stored in the data storage units, to an internal circuit of the nonvolatile memory device at the same time according to a second control signal.

7. The method of claim 6, further comprising performing the test using the data transferred to the internal circuit.

8. The method of claim 6, further comprising:
   inputting results of performing the test using the data to the respective data storage units; and
   sequentially outputting the result data, stored in the data storage units, through the first IO stage according to respective third control signals.

9. The method of claim 8, wherein the first to third control signals are outputted in synchronism with an externally input clock signal.

10. The method of claim 6, wherein a number of nonvolatile memory devices are tested at the same time in the test mode.

11. The method of claim 6, wherein the first control signals comprise n number of data input enable signals which enable the data, sequentially applied to the data storage units and inputted through the first IO stage, to be sequentially stored in the data storage units.

12. The method of claim 8, wherein the third control signals comprise n number of data output enable signals which enable the data, sequentially applied to the data storage units and stored in the data storage units through the first IO stage, to be sequentially outputted.

13. A semiconductor memory apparatus comprising a number of semiconductor dies electrically coupled to a tester through a plurality of channels, said each semiconductor die comprising:
    a clock input stage configured to receive a clock signal for a test through at least one channel;
    a control signal output unit configured to output data input-output (IO) control signals according to the clock signal;
    n number of IO stages for data IO, n being a positive integer; and
    n number of storage units connected to the respective n number of IO stages and configured to temporarily store data to be exchanged between the respective n number of IO stages and internal circuits according to the respective data IO control signals,
    wherein a first IO stage of the n number of IO stage is coupled to at least one channel, and the n number of storage units are further commonly coupled to the first IO stage and configured to sequentially input or output data through the first IO stage in a test mode, according to the respective data IO control signals.

14. The semiconductor memory apparatus of claim 13, wherein the data IO control signals in the test mode comprise:
    n number of data input enable signals to allow data bits inputted through the first IO stage to be sequentially stored in the respective n number of storage units, and
    a first control signal to allow the data bits stored in the respective n number of storage units to be outputted to internal circuits at the same time.

15. The semiconductor memory apparatus of claim 13, wherein the data IO control signals in the test mode comprise:
    n number of data output enable signals sequentially generated to allow test result data stored in the n number of storage units to be sequentially outputted to the first IO stage.

16. The semiconductor memory apparatus of claim 13, wherein each of the n number of storage units comprises:
    a latch unit configured to temporarily store IO data;
    a multiplexer (MUX) connected to the first IO stage and a pertinent one of the n number of IO stages and configured to select one of the first IO stage and the pertinent IO stage according to a pertinent one of the data IO control signals;
    an input unit configured to transfer data, inputted from the MUX to the latch unit; and
    an output unit configured to transfer the data, stored in the latch unit, to the MUX.

* * * * *